(12) United States Patent
Takeda

(10) Patent No.: US 6,754,088 B2
(45) Date of Patent: Jun. 22, 2004

(54) EMITTED-RADIO-WAVE SHIELD AND IMAGE FORMING APPARATUS USING SAME

(75) Inventor: Shohei Takeda, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/897,933

(22) Filed: Jul. 5, 2001

(65) Prior Publication Data

US 2002/0012241 A1 Jan. 31, 2002

(30) Foreign Application Priority Data

Jul. 25, 2000 (JP) ..................................... 2000-224283

(51) Int. Cl.[7] .................................................. H05K 9/00
(52) U.S. Cl. ..................... 361/818; 361/816; 174/35 R
(58) Field of Search .................................. 361/752–753, 361/800, 816, 818, 756–759, 825–829; 174/51, 35 R, 35 MS, 35 GC; 439/607; 248/220.21

(56) References Cited

U.S. PATENT DOCUMENTS

| | | | | |
|---|---|---|---|---|
| 5,170,321 A | * | 12/1992 | Oslund et al. | 174/35 GC |
| 5,383,098 A | * | 1/1995 | Ma et al. | 174/35 GC |
| 5,591,050 A | * | 1/1997 | Sueoka | 439/607 |
| 5,895,884 A | * | 4/1999 | Davidson | 174/35 R |
| 5,919,062 A | * | 7/1999 | Wu | 439/607 |
| 6,051,780 A | * | 4/2000 | Furhmann et al. | 174/35 GC |
| 6,194,653 B1 | * | 2/2001 | McMiller et al. | 174/35 GC |
| 6,301,125 B1 | * | 10/2001 | Maeda | 361/818 |

* cited by examiner

Primary Examiner—David A. Zarneke
Assistant Examiner—Tuan Dinh
(74) Attorney, Agent, or Firm—Fitzpatrick, Cella, Harper & Scinto

(57) ABSTRACT

An emitted-radio-wave shield capable of preventing the leakage of emitted radio waves from a circuit board includes a shield box, which houses the circuit board, and a shield plate that is easy to attach and remove in order to access the circuit board. A shield member, which is disposed at a joint between the shield box and the shield plate and is electrically connected with the shield box, shields emitted radio waves from the circuit board in a state in which the shield plate is secured to the shield box. The shield plate is formed to have a plurality of protrusions, which project toward the shield member, at a part thereof that contacts the shield member.

9 Claims, 5 Drawing Sheets

EMITTED-RADIO-WAVE SHIELD AND IMAGE FORMING APPARATUS USING SAME

FIELD OF THE INVENTION

This invention relates to a shield for emitted radio waves and an image forming apparatus that uses such a shield. More particularly, the invention relates to art that makes the assembly and inspection of such apparatus more efficient.

BACKGROUND OF THE INVENTION

A shield against emitted radio waves in the conventional image forming apparatus includes a shield box the opening of which is formed to have a flange, and a shield plate secured to the flange using screws that are threadedly engaged with screw holes formed in the flange at prescribed intervals. A board for image processing is secured to the bottom side of the shield box by screws or the like. This arrangement prevents the escape of radio waves emitted from the board for image processing.

An alternative arrangement is shown in FIG. 5, which is an external perspective view of an emitted-radio-wave shield according to the prior art. This shield includes a shield box 201 the opening of which has flanges 201b formed on its four sides 201a, and a shield plate 203 secured to the flanges 201b using screws 210 that are threadedly engaged with screw holes 201c formed in the flanges 201b at prescribed intervals. A board 202 (indicated by the dashed lines) for image processing is secured to the bottom side of the shield box 201 by screws or the like (not shown). Further, the shield plate 203 is secured to the flanges 201b of the shield box via shield members 204 that have been cut to prescribed lengths, thereby reducing the number of screws 210 needed to secure the shield plate 203 to the shield box 201.

With the emitted-radio-wave shield constructed as set forth above, a large number of the screws 210 are necessary to secure the shield plate 203 to the shield box 201. When the board 202 for image processing is accessed, all of the screws 210 must be removed. Such an arrangement has a poor workability.

Further, when shield members 204 are provided, as shown in FIG. 5, it is difficult to provide sufficient flatness for the shield plate 203. As a result, in order to reliably prevent the escape of radio waves from the board 202, securing by way of the screws 210 is required. Though it is possible to reduce the number of screws over the former arrangement, there is still not much improvement in workability.

SUMMARY OF THE INVENTION

Accordingly, an object of the present invention is to provide an emitted-radio-wave shield and an image forming apparatus that uses such a shield, the shield being composed of a shield box, which houses a circuit board, and a shield plate, wherein the operation for attaching and removing the shield plate in order to access the board is simplified and leakage of emitted radio waves can be prevented.

According to the present invention, an emitted-radio-wave shield comprises a shield box housing a circuit board; a shield plate removably secured to the shield box; and a shield member, which is disposed at a joint between the shield box and the shield plate and is electrically connected with the shield box, for shielding emitted radio waves from the circuit board in a state in which the shield plate is secured to the shield box; wherein the shield plate is formed to have a plurality of protrusions, which project toward the shield member, at a part thereof that contacts the shield member.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 2, including FIG. 2A illustrates a first embodiment having shield members attached to flanges of a shield box, and FIG. 2B illustrates a second embodiment having the shield members attached to a shield plate opposite the flanges of the shield box.

DESCRIPTION OF THE PREFERRED EMBODIMENT

Figure 1A:
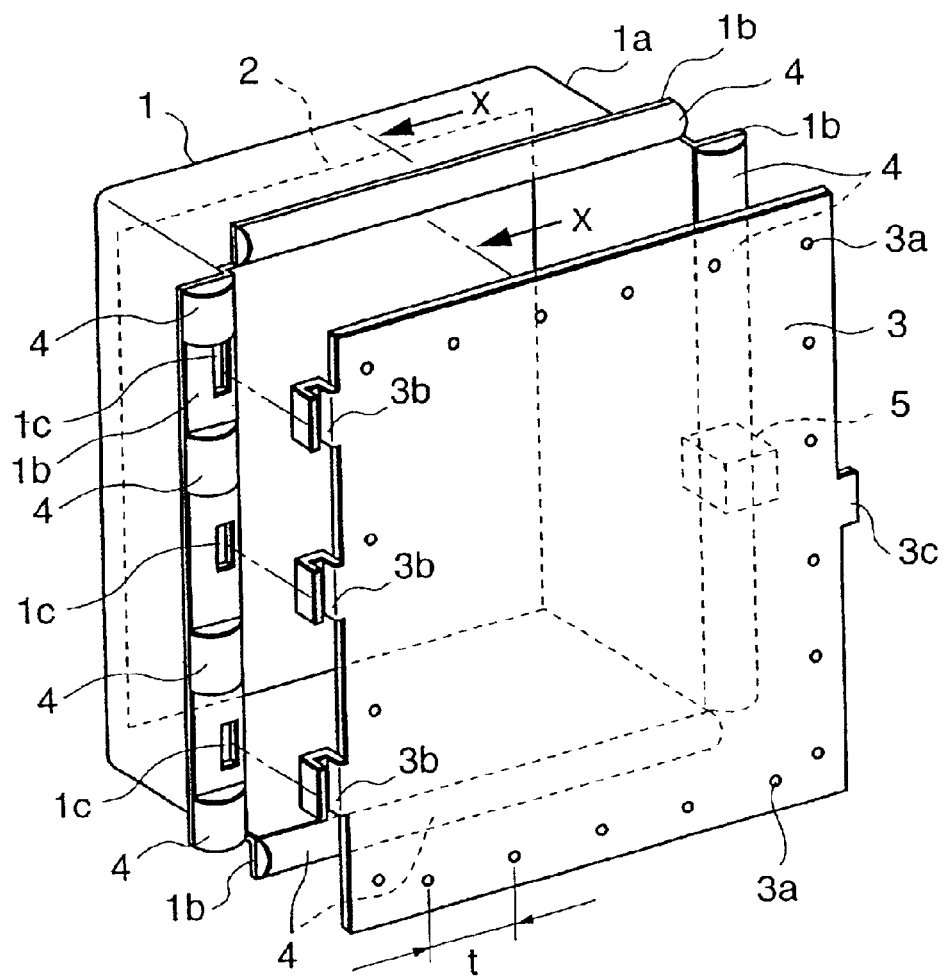
FIG. 1A is an external perspective view illustrating an emitted-radio-wave shield according to the present invention and showing the manner in which a shield plate is secured to a shield box.
Figure 1B:
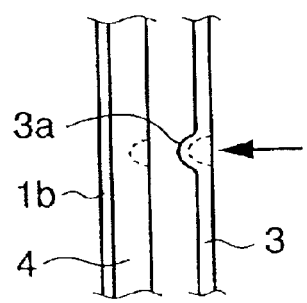
FIG. 1B is a sectional view taken along line X—X of FIG. 1A.

A preferred embodiment of the present invention will now be described with reference to the accompanying drawings, in which FIG. 1A is an external perspective view illustrating an emitted-radio-wave shield according to the present invention and showing the manner in which a shield plate 3 is secured to a shield box 1, and FIG. 1B is a sectional view taken along line X—X of FIG. 1A.

As shown in FIG. 1A, a board 2 indicated by the dashed line is an image processing board for processing and converting image information, by way of example. The board 2 is secured to the bottom side of the shield box 1 by screws, whereby the board 2 is surrounded by the shield box 1. Flanges 1b on the four sides of the opening to the shield box 1 are formed as illustrated by being bent from side walls 1a.

The rectangular shield plate 3, the shape of which is sized approximately to the outer edges of the flanges 1b, is provided so as to be attachable and detachable in the manner illustrated. With the shield plate 3 secured to the shield box 1, radio waves emitted from the board 2 are blocked.

Figure 2A:
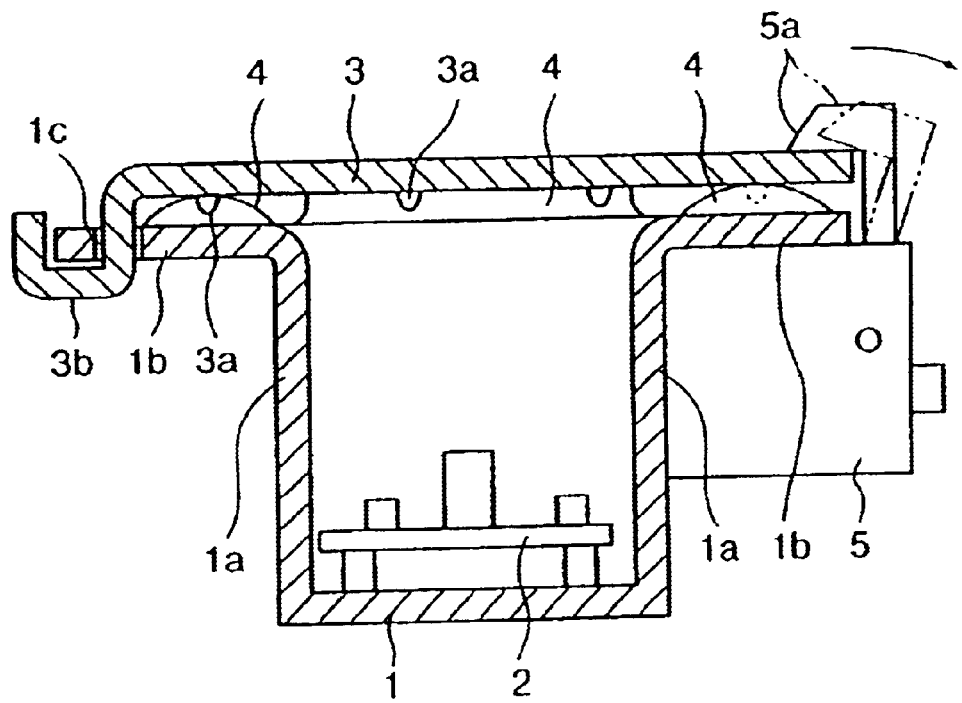
FIGS. 2A and 2B, is a sectional view showing a principal portion of the omitted-radio-wave shield, where

In a first embodiment, as illustrated in FIG. 2A, four shield members 4 formed from resilient bodies are secured on respective ones of the four flanges 1b, which constitute the joining surfaces of the shield box 1 and shield plate 3, so as to be electrically connected to the shield box 1.

A plurality of protrusions 3a formed to project toward the side of the shield members, as shown in FIG. 1B, are formed at prescribed intervals t on the portion of the shield plate 3 that contacts the shield members 4.

Furthermore, one of the four edges of the shield plate 3 is formed to have three projections 3b, and three through-holes 1c are formed in one of the flanges 1b that corresponds to the above-mentioned one edge of the shield plate 3. The three projections 3b are mated with respective ones of the three through-holes 1c, whereby a locked state is achieved by moving in an arrow-direction shown in FIG. 2. The edge of the shield plate 3 opposite the above-mentioned one edge is formed to have a locking portion 3c for locking engagement with locking means 5 (indicated by the broken lines) secured to the shield box 1.

In order to attach the shield plate 3, as shown in the sectional view of the emitted-radio-wave shield in FIG. 2, the projection 3b of the shield plate 3 is engaged with the through-hole 1c of the flange 1b of shield box 1, after which the shield plate 3 is locked by engaging a locking pawl 5a of the locking means 5.

By thus making it possible to attach and detach the shield plate 3, access to the board 2 is improved. Further, by integrally securing the shield plate 3 to the shield box 1, leakage of radio waves emitted from the board 2 is prevented. The shield members 4, which prevent the leakage of emitted radio waves from the gap between the shield box 1 and shield plate 3, consist of a resilient body and serve to compensate for poor flatness of the shield plate 3 caused by warping or the like.

In the arrangement described above, the shield plate 3 is provided with the protrusions 3a at the intervals t and the shield members 4 are secured in a contact state in which they are electrically connected to the shield box 1. The arrangement is such that the protrusions 3a press the shield members 4.

By virtue of this arrangement, leakage of radio waves emitted from the board 2 can be prevented reliably by securing the shield plate 3 to the shield box 1, and the board 2 can be accessed through a simple operation.

Figure 2B:
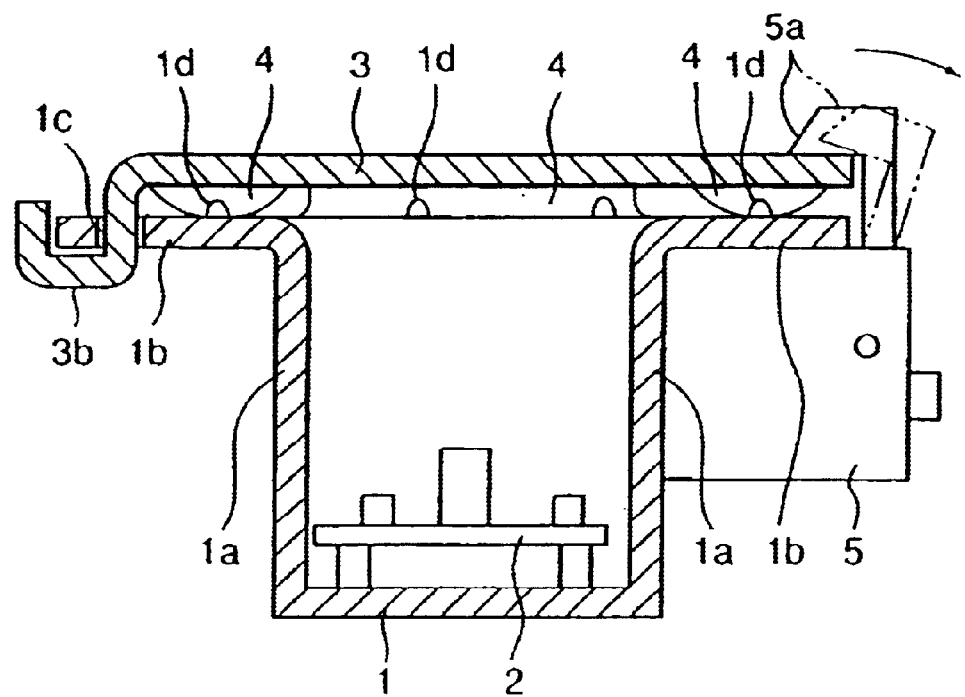

In a second, alternative embodiment, as illustrated in FIG. 2B, the same effects can be obtained by securing the shield members 4 in a state in which they are electrically connected to the shield plate 3 and providing the shield box 1 with protrusions.

Thus, by securing the shield members in a state in which they are electrically connected to the shield box and providing the shield plate at regular intervals with a plurality of protrusions at positions where they oppose the shield members, leakage of radio waves emitted from the board can be prevented. In addition, it is unnecessary to remove a large number of screws in order to access the board, as a result of which operability is improved.

Figure 3:
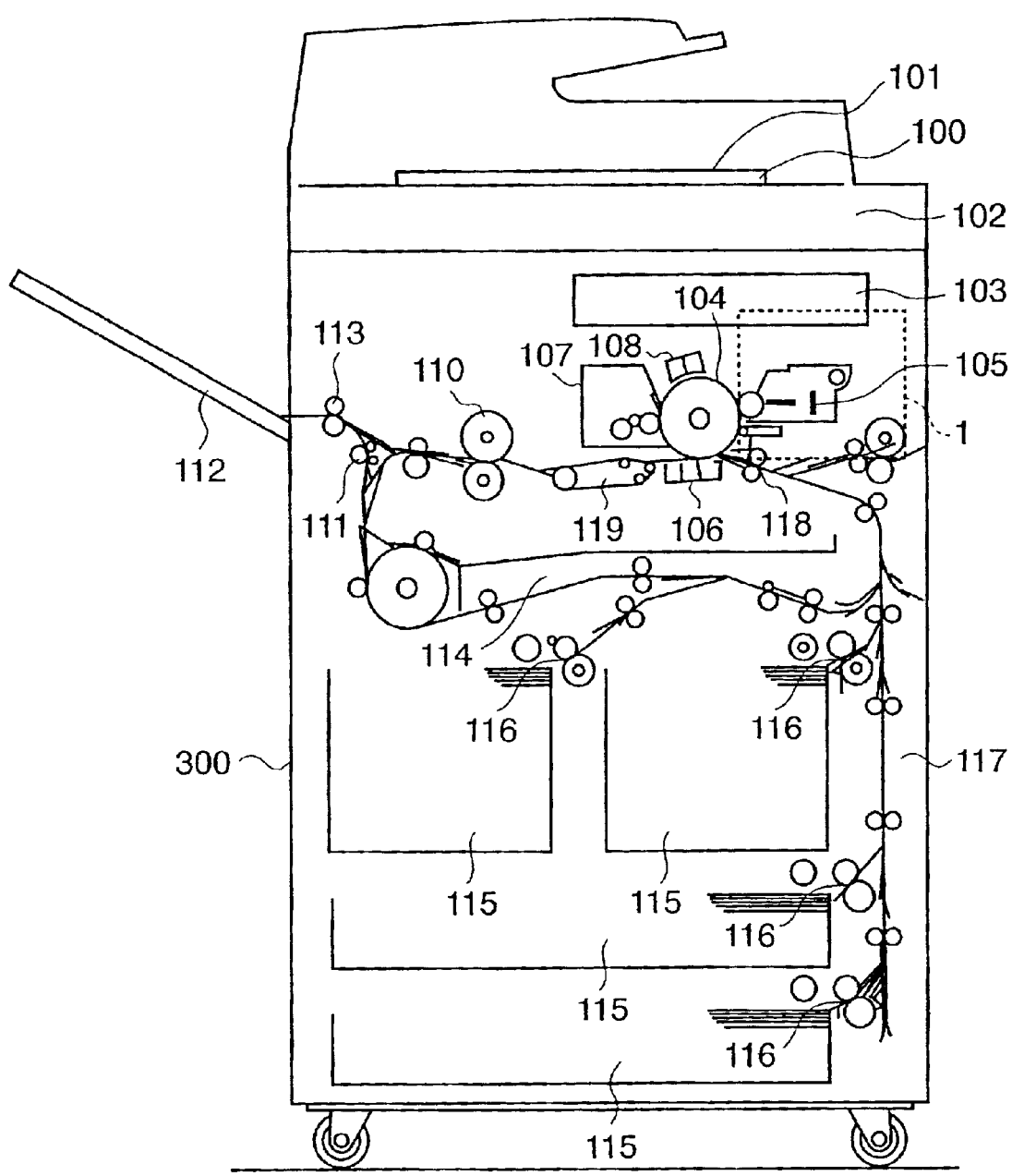
FIG. 3 is a sectional view useful in describing an image forming apparatus according to the present invention.

FIG. 3 is a sectional view illustrating an image forming apparatus 300 according to the present invention. Shield box 1 is fixed to a rear frame of the image forming apparatus 300.

As shown in FIG. 3, a document 101 is placed upon a document glass 100 and information on the document 101 is read by a reader unit 102. Information from the reader unit 102 is processed via an image processing unit (not shown). A laser scanning unit 103 causes a laser, which is turned on and off by a controlled electric signal, to irradiate a prescribed position on a drum 104 so that the document information from the document 101 will be recorded.

Placed about the periphery of the drum 104 in the manner shown are a developing unit 105 for supplying the drum 104 with toner to visualize an electrostatic latent image on the drum 104, a transfer/separating discharge unit 106 for transferring the toner image to printing paper P and peeling the paper off of the drum to which it is being electrostatically attracted, a cleaning unit 107 for removing residual toner that has not been transferred from the drum 104 to the paper P, and an exposure unit 108 for erasing the latent image from the drum 104.

Also provided is a transport unit 109 for transporting the paper P, to which the toner image has been transferred, from the drum 104 to the a fixing unit 110.

A paper ejection/reversal unit 111 is provided. Under the control of the paper ejection/reversal unit 111, paper P that has exited the fixing unit 110 is ejected into an external output tray 112 by ejection rollers 113 or, when doubled-sided or multiple copying is performed, the paper P is transported to a paper refeed unit 114, which feeds the paper P again. Also provided is a paper cassette 115 in which sheets of the paper P are stacked and stored.

In operation, the user presses a copy start button (not shown), whereupon the paper P stacked in the cassette 115 is transported from the cassette 115 to a vertical-path transport unit 117 one sheet at a time by a paper feed unit 116. The paper P is thus sent to registration rollers 118.

Next, scanning is started to convert the document information of document 101 to an electric signal by the reader unit 102. The document information is recorded on the drum 104 by the laser scanner unit 103 via the image processing unit (not shown). At the same time, the registration rollers 118 start transporting the paper P.

At this time the electrostatic latent image of the document information on drum 104 is rendered into a toner image by the developing unit 105. The toner image is transferred to the paper P by the transfer/separating unit 106 and the paper P is then transported to the fixing unit 110 by the transport unit 109. After the toner image is fixed to the paper P by the fixing unit 110, the paper P is transported to the ejection rollers 113 by the paper ejection/reversal unit 111 if single-sided copying is to be performed. As a result, the paper P is ejected into the output tray 112.

If double-sided or multiple copying is to be performed, the paper P on which the toner image has been fixed by the fixing unit 110 is sent to the refeeder 114 by the paper ejection/reversal unit 111. The paper P is transported to the drum 104 again by the refeeder 114, the toner image is transferred from the drum to the paper and the paper is then ejected into the output tray 112 via the transport unit 109, fixing unit 110, paper ejection/reversal unit 111 and ejection rollers 113.

Sensors are provided at a plurality of positions along the paper transport path. During the series of operations described above, the sensors sense that the paper P is being delayed if it does not arrive at a certain position upon elapse of a fixed period of time from start of feed, or sense that the paper P is at rest at a certain position if it does not pass by this position upon elapse of a fixed period of time after arriving. If such delay or residence is sensed, a paper-jam indication is presented on a console (not shown) and a control circuit (not shown) operates so as to halt the entire apparatus or a part thereof in order to stop the transport of the paper.

Figure 4:
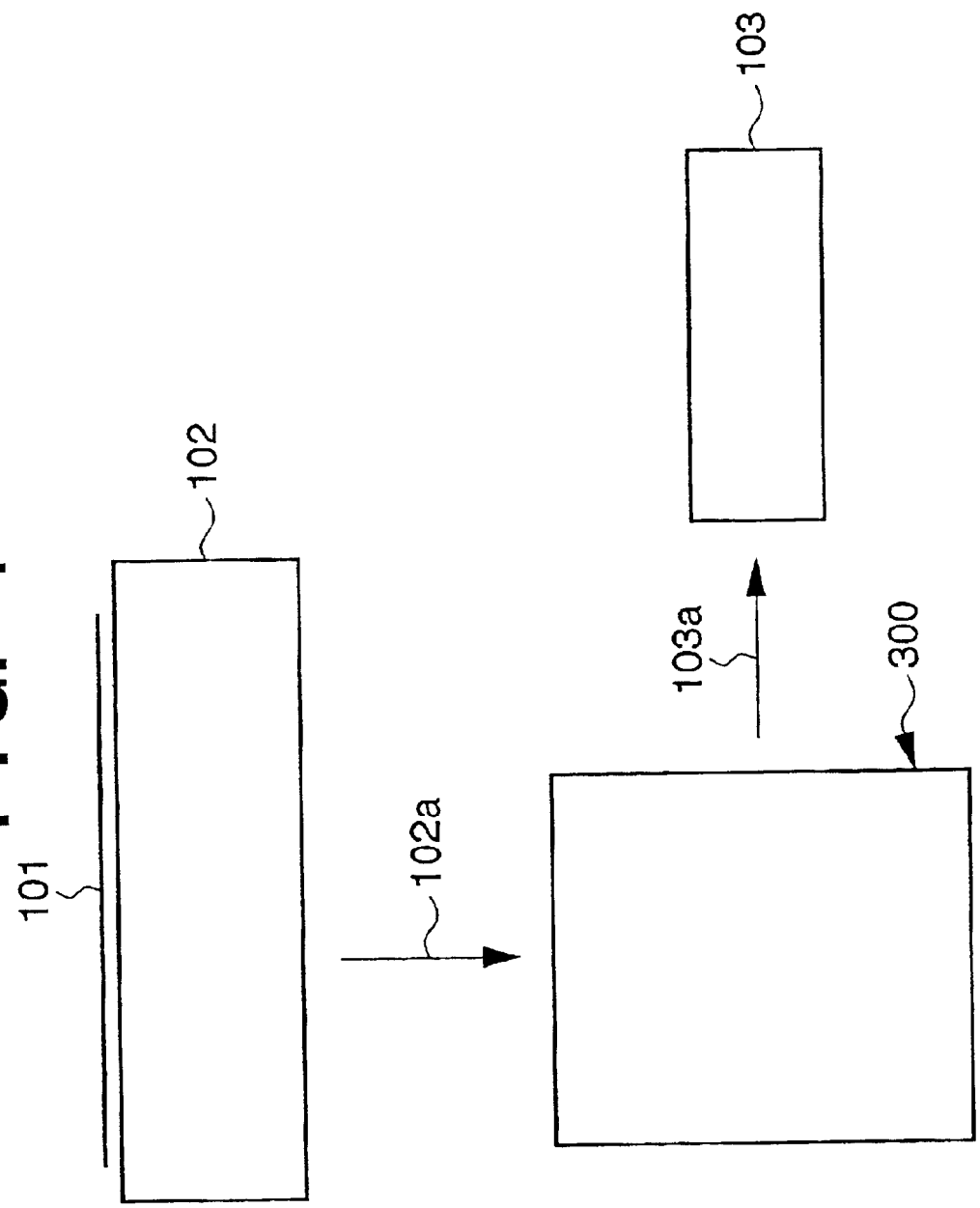
FIG. 4 is a block diagram illustrating the relationship among a reader unit, a laser scanner unit and an image processing unit.
Figure 5:
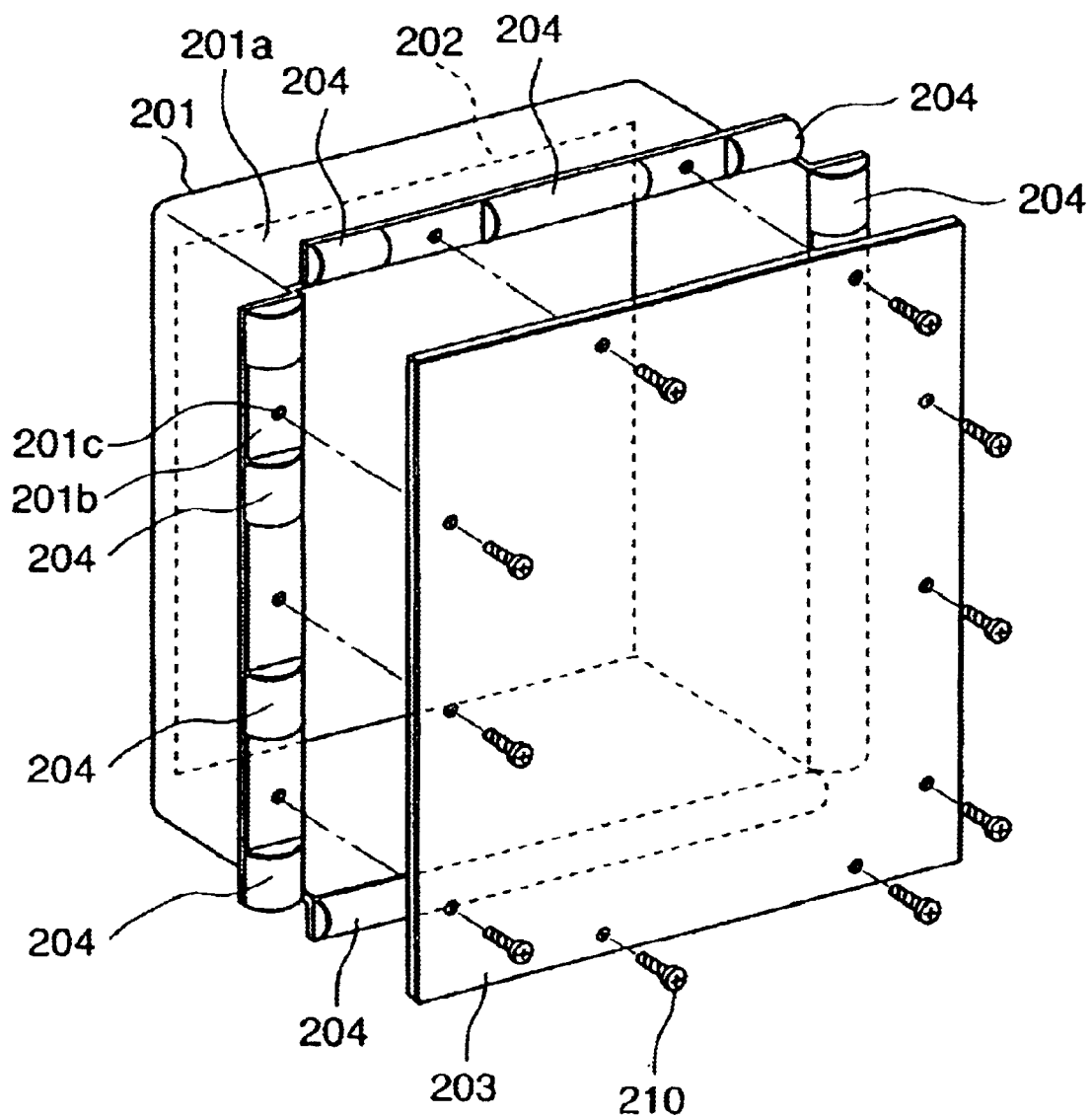
FIG. 5 is an external perspective view of an emitted-radio-wave shield according to the prior art.

Reference will be had to the block diagram of FIG. 4 to describe the relationship among the reader unit 102, laser scanner unit 103 and an image processing unit 300 (provided within the shield box 1). The document information representing the document 101 is converted to an electric signal by the reader unit 102, the electric signal is sent to the image processing unit 1000 by a signal cable 102a, the image processing unit 1000 subjects the signal to image conversion and other processing and then sends the processed signal to the laser scanner unit 103 by a signal cable 103a.

The board 2 of the image processing unit 300 is housed in the shield box 1 of the emitted-radio-wave shield described above in conjunction with FIG. 1. As a result, the influence of deleterious radio waves upon the externally located reader unit 102 and laser scanner unit 103 can be minimized.

Thus, leakage of emitted radio waves from an image processing board can be prevented reliably and operability is enhanced by making it unnecessary to remove many screws or the like to access the image processing board. In addition, tools are unnecessary because the shield plate is not secured to the shield plate by screws. Furthermore, resilient bodies are used as the shield members, thereby making it possible to compensate for poor flatness of the shield plate caused by warping or the like.

Thus, the present invention makes it possible to provide an emitted-radio-wave shield and an image forming apparatus that uses such a shield, the shield being composed of a shield box, which houses a circuit board, and a shield plate, wherein the operation for attaching and removing the shield plate in order to access the board is simplified and leakage of emitted radio waves can be prevented.

As many apparently widely different embodiments of the present invention can be made without departing from the spirit and scope thereof, it is to be understood that the invention is not limited to the specific embodiments thereof except as defined in the appended claims.

What is claimed is:

1. An emitted-radio-wave shield comprising:

a shield box housing a circuit board;

a shield plate removably secured to said shield box; and a shield member, having an attaching surface and an opposite contacting surface, which is formed from a resilient body, and which is disposed at a joint surface portion between said shield box and said shield plate, and is attached to one of said shield box and said shield plate, for shielding emitted radio waves from the circuit board in a state in which said shield plate is secured to said shield box;

wherein the other one of said shield box and said shield plate is formed to have a plurality of protrusions, which project toward said contacting surface of said shield member, so as to contact and press said shield member, such that said contacting surface of said shield member deforms in a concave shape so as to engage with said protrusions.

2. The emitted-radio-wave shield according to claim 1, wherein said shield box has a locking means, and said shield plate has a locking portion to be locked to said locking means.

3. An emitted-radio-wave shield according to claim 1, wherein said shield member is attached in electrical connection to said shield box by directly contacting with said shield box.

4. An emitted-radio wave shield comprising:

a shield box housing a circuit board:

a shield plate removably secured to said shield box; and a shield member formed from a resilient body, which is disposed at a joint surface portion between said shield box and said shield plate, and is attached to one of said shield box and said shield plate, for shielding emitted radio waves from the circuit board in a state in which said shield plate is secured to said shield box;

wherein the other one of said shield box and said shield plate is formed to have a plurality of protrusions at regular intervals of 60 mm or less, which protrusions project toward said shield member, so as to contact and press said shield member, such that a surface of said shield member deforms in a concave shape so as to engage with said protrusions.

5. An emitted-radio-wave shield comprising:

a shield box housing a circuit board, said shield box having an opening, which is formed to include a flange, and locking means;

a shield plate removably secured to the flange; and a shield member formed from a resilient body and, which is disposed on the flange constituting a joint between said shield box and said shield plate and is attached to said shield box, for shielding emitted radio waves from the circuit board in a state in which said shield plate is secured to said shield box;

wherein said shield plate is formed to have a plurality of protrusions, which project toward said shield member, so as to contact and press said shield member;

one edge of said shield plate is formed to have projections and said flange is formed to have corresponding through-holes for mating with respective ones of the projections; and an edge of said shield plate opposite said one edge is formed to have a locking portion for locking engagement with said locking means of said shield box.

6. The shield according to claim 5, wherein said plurality of protrusions are formed on said shield plate at regular intervals.

7. An emitted-radio-wave shield according to claim 5, wherein said shield member is attached in electrical connection to said shield box by directly contacting with said shield box.

8. The shield according to claim 6, wherein the regular interval is 60 mm or less.

9. An image forming apparatus comprising:

an image processing circuit board that converts an image to an electrical signal and processes the electrical signal of the image; and an emitted-radio-wave shield comprising:

a shield box housing said image processing circuit board;

a shield plate removably secured to said shield box; and a shield member formed from a resilient body and, which is disposed at a joint between said shield box and said shield plate and is attached to said shield box, for shielding emitted radio waves from the circuit board in a state in which said shield plate is secured to said shield box;

wherein said shield plate is formed to have a plurality of protrusions, which project toward said shield member, so as to contact and press said shield member, such that a surface of said shield member deforms in a concave shape so as to engage with said protrusions.

* * * * *

UNITED STATES PATENT AND TRADEMARK OFFICE
CERTIFICATE OF CORRECTION

PATENT NO. : 6,754,088 B2
DATED : June 22, 2004
INVENTOR(S) : Shohei Takeda

It is certified that error appears in the above-identified patent and that said Letters Patent is hereby corrected as shown below:

Column 2,
Line 19, "omitted-radio-wave" should read -- emitted-radio-wave --.
Line 24, "box." should read -- box; --.

Column 3,
Line 3, "1$c$," should read -- 1$c$, --.

Column 4,
Line 7, "doubled-" should read -- double- --.

Column 5,
Line 53, "board:" should read -- board; --.

Signed and Sealed this

Seventh Day of December, 2004

JON W. DUDAS
*Director of the United States Patent and Trademark Office*